(12) United States Patent
Yamamoto et al.

(10) Patent No.: US 9,966,261 B1
(45) Date of Patent: May 8, 2018

(54) METHOD OF MANUFACTURING SEMICONDUCTOR DEVICE

(71) Applicant: HITACHI KOKUSAI ELECTRIC INC., Tokyo (JP)

(72) Inventors: Katsuhiko Yamamoto, Toyama (JP); Naofumi Ohashi, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days. days.

(21) Appl. No.: 15/632,806

(22) Filed: Jun. 26, 2017

(30) Foreign Application Priority Data

Mar. 2, 2017 (JP) .................................. 2017-039349

(51) Int. Cl.
| | |
|---|---|
| *H01L 21/033* | (2006.01) |
| *H01L 21/311* | (2006.01) |
| *H01L 21/3213* | (2006.01) |
| *H01L 21/02* | (2006.01) |
| *H01L 21/308* | (2006.01) |
| *C23C 16/455* | (2006.01) |
| *C23C 16/40* | (2006.01) |

(52) U.S. Cl.
CPC .......... *H01L 21/0332* (2013.01); *C23C 16/40* (2013.01); *C23C 16/45525* (2013.01); *C23C 16/45527* (2013.01); *C23C 16/45553* (2013.01); *H01L 21/0228* (2013.01); *H01L 21/02164* (2013.01); *H01L 21/02225* (2013.01); *H01L 21/3081* (2013.01); *H01L 21/31116* (2013.01); *H01L 21/31122* (2013.01); *H01L 21/32137* (2013.01)

(58) Field of Classification Search
None
See application file for complete search history.

(56) References Cited

U.S. PATENT DOCUMENTS

| | | | |
|---|---|---|---|
| 2004/0194691 A1* | 10/2004 | George | ................ B01J 31/069 117/84 |
| 2011/0070380 A1* | 3/2011 | Shero | .................... C01B 13/11 427/569 |
| 2015/0275357 A1 | 10/2015 | Kamakura et al. | |
| 2016/0300756 A1 | 10/2016 | Somervell et al. | |

FOREIGN PATENT DOCUMENTS

| | | |
|---|---|---|
| JP | 2015-183271 A | 10/2015 |
| JP | 2016-201542 A | 12/2016 |

* cited by examiner

*Primary Examiner* — Jiong-Ping Lu
(74) *Attorney, Agent, or Firm* — Volpe and Koenig, P.C.

(57) ABSTRACT

Described herein is a technique capable of improving the uniformity of device characteristics. A method of manufacturing a semiconductor device may include: (a) accommodating in a process chamber a substrate having an organic film thereon; (b) supplying a metal-containing gas to the substrate; (c) supplying a first oxygen-containing gas and a dilute gas to the substrate, the dilute gas containing at least one of a second oxygen-containing gas and an inert gas; (d) performing a cycle a predetermined number of time, the cycle including (b) and (c), wherein a flow rate of the first oxygen-containing gas is equal to or greater than a flow rate of the dilute gas in one of the cycle performed the predetermined number of time.

12 Claims, 14 Drawing Sheets

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2017-039349, filed on Mar. 2, 2017, the entire contents of which are hereby incorporated by reference.

BACKGROUND

1. Field

The present disclosure relates to a method of manufacturing a semiconductor device.

2. Description of the Related Art

The process of forming a film on a substrate by supplying a process gas and a reactive gas to the substrate is performed as one of the manufacturing processes of the semiconductor device.

In recent years, the technical requirement for miniaturization of the semiconductor device has been advanced. While the semiconductor device is formed on the substrate, the uniformity of device characteristics may be degraded.

SUMMARY

Described herein is a technique capable of improving the uniformity of device characteristics.

According to one aspect of the technique described herein, a method of manufacturing a semiconductor device may include: (a) accommodating in a process chamber a substrate having an organic film thereon; (b) supplying a metal-containing gas to the substrate; (c) supplying a first oxygen-containing gas and a dilute gas to the substrate, the dilute gas containing at least one of a second oxygen-containing gas and an inert gas; (d) performing a cycle a predetermined number of time, the cycle including (b) and (c), wherein a flow rate of the first oxygen-containing gas is equal to or greater than a flow rate of the dilute gas in one of the cycle performed the predetermined number of time.

DETAILED DESCRIPTION

Embodiment (1) Configuration of Substrate Processing Apparatus

A substrate processing apparatus according to an embodiment will be described.

A substrate processing apparatus 100 according to the embodiment will be described. The substrate processing apparatus 100 includes, for example, a single wafer substrate processing apparatus. The processes for manufacturing a semiconductor device are performed by the substrate processing apparatus 100.

Figure 1:
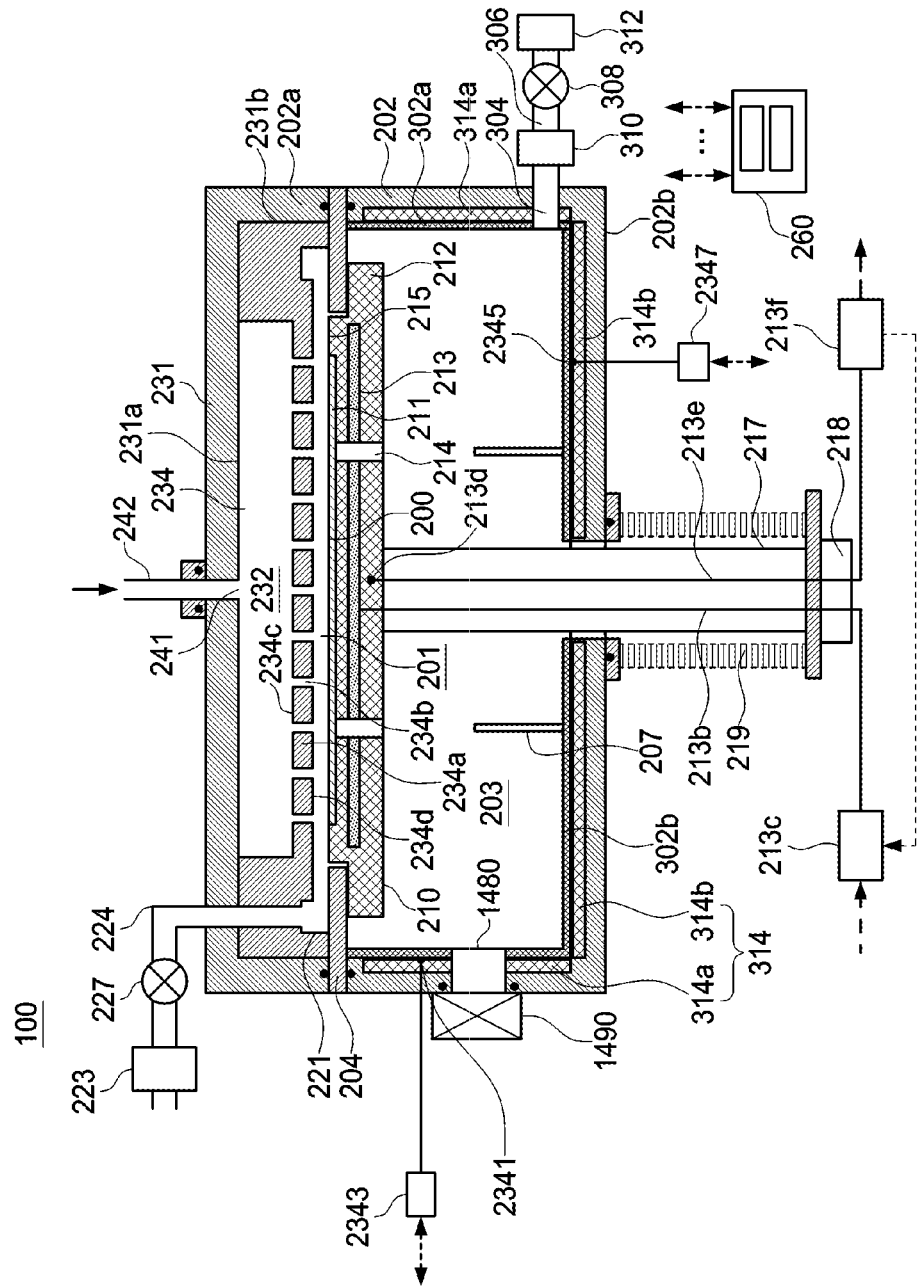
FIG. 1 schematically illustrates a vertical cross-section of a substrate processing apparatus according to an embodiment.

As shown in FIG. 1, the substrate processing apparatus 100 includes a process vessel 202. For example, the process vessel 202 is a flat and sealed vessel having a circular horizontal cross-section. The process vessel 202 is made of a metal material such as aluminum (Al) and stainless steel (SUS) or quartz. A processing space (process chamber) 201 where a wafer 200 such as a silicon wafer is processed and a transfer space (transfer chamber) 203 are provided in the process vessel 202. The process vessel 202 includes an upper vessel 202a and a lower vessel 202b. A partition plate 204 is provided between the upper vessel 202a and the lower vessel 202b. A space above the partition plate 204 surrounded by the upper vessel 202a is referred to as the process chamber 201 and a space under the partition plate 204 surrounded by the lower vessel 202b and is referred to as the transfer chamber 203.

A substrate loading/unloading port 1480 is provided on a side surface of the lower vessel 202b adjacent to a gate valve 1490. The wafer 200 is moved between a vacuum transfer chamber (not shown) and the transfer chamber 203 through the substrate loading/unloading port 1480. Lift pins 207 are provided at the bottom of the lower vessel 202b. The lower vessel 202b is electrically grounded.

A substrate support unit 210 is provided in the process chamber 201 to support the wafer 200. The substrate support unit 210 includes a substrate support 212 having a substrate placing surface 211 on which the wafer 200 is placed and an outer peripheral surface 215 around the substrate placing surface 211. Preferably, the substrate support unit 210 further includes a heater 213 serving as a first heating unit. When the substrate support unit 210 further includes the heater 213 serving as the first heating unit, the wafer 200 may be heated by the heater 213. As a result, the quality of the film formed on the wafer 200 can be improved. Through-holes 214 penetrated by the lift pins 207 penetrate are provided in the substrate support 212 at positions corresponding to the lift pins 207. The substrate placing surface 211 provided on the surface of the substrate support 212 may be lower than the outer peripheral surface 215 by a height corresponding to the thickness of the wafer 200. The difference between the height of the upper surface of the wafer 200 and the height of the outer peripheral surface 215 of the substrate support 212 may be thereby reduced. Therefore, the turbulence of the gas caused by the difference in heights may be suppressed. The height of the outer peripheral surface 215 may be equal to or lower than the height of the substrate placing surface 211 when the turbulence of the gas does not affect the uniformity of the processing of the wafer 200.

The substrate support 212 is supported by a shaft 217. The shaft 217 penetrates the bottom of the process vessel 202 and is connected to an elevating mechanism 218 at the outside of the process vessel 202. The wafer 200 placed on the substrate placing surface 211 may be elevated and lowered by elevating and lowering the shaft 217 and the substrate support 212 by the elevating mechanism 218. A bellows 219 covers the lower portion of the shaft 217 to maintain the inside of the process chamber 201 airtight.

When the wafer 200 is transported, the substrate support 212 is lowered until the substrate placing surface 211 of the substrate support 212 is at a height of the substrate loading/unloading port 1480 (hereinafter referred to as "wafer transfer position"). When the wafer 200 is processed, the substrate support 212 is elevated until the wafer 200 reaches a processing position in the process chamber 201 (hereinafter referred to as "wafer processing position") as shown in FIG. 1.

Specifically, when the substrate support 212 is lowered to the wafer transfer position, the upper ends of the lift pins 207 protrude from the upper surface of the substrate placing surface 211, and the lift pins 207 supports the wafer 200 from thereunder. When the substrate support 212 is elevated to the wafer processing position, the lift pins 207 are retracted from the upper surface of the substrate placing surface 211 and the substrate placing surface 211 supports the wafer 200 from thereunder. Preferably, the lift pins 207 are made of a material such as quartz and alumina since the lift pins 207 are in direct contact with the wafer 200.

A second heating unit 314 (also referred to as "transfer chamber heating unit"), which is a temperature adjusting unit, is provided in the inner wall of the lower vessel 202b. The second heating unit 314 is configured to heat the transfer chamber 203 itself and each component in the transfer chamber 203. The second heating unit 314 prevents the gas from being adsorbed on the surface of the lower container 202b by maintaining the gas in the transfer chamber 203 at a temperature higher than the boiling point of a liquid source. Preferably, the second heating unit 314 is configured to heat the transfer chamber 203 itself and each component provided in the transfer chamber 203 such that the gas is not liquefied. The second heating unit 314 may also suppress the adsorption of the oxidizing agent on the surface of the lower vessel 202b or the surface of a adsorption preventing part 302 described later. Herein, "liquefaction" refers to phenomena such as condensation.

The second heating unit 314 includes at least one of a lateral temperature adjusting unit 314a and a bottom temperature adjusting unit 314b. Temperature measuring units 2341 and 2345 measure the temperatures of the side portion and the bottom portion of the lower vessel 202b, respectively. Temperature control units 2343 and 2347 are configured to control the lateral temperature adjusting unit 314a and the bottom temperature adjusting unit 314b. The side portion and the bottom portion of the transfer chamber 203 may be uniformly heated by the second heating unit 314. The temperature control units 2343 and 2347 are electrically connected to a controller 260 described later and are controlled by the controller 260. By heating the transfer chamber 203 with the second heating unit 314, the transfer chamber 203 may be uniformly heated and gas is prevented from adsorbing onto the components of the transfer chamber 203.

The lateral temperature adjusting unit 314a surrounds the transfer chamber 203. The bottom temperature adjusting unit 314b is provided at the bottom of the transfer chamber 203. The temperatures of the temperature adjusting units 314a and 314b are adjusted by the electric power supplied to each of the temperature adjusting units 314a and 314b under the control of the controller 260. Preferably, the temperature of the transfer chamber 203, which is heated in the film-forming step described later, is higher than a predetermined temperature such that one of or both of the first gas and the second gas is not adsorbed. The temperature of the transfer chamber 203 is higher than the temperature at which the oxidizing agent is liquefied. If the oxidizing agent is liquefied, the transfer chamber 203 may be heated to evaporate the oxidizing agent. The temperature of the lateral temperature adjusting unit 314a may differ from that of the bottom temperature adjusting unit 314b. For example, the temperature of the lateral temperature adjusting unit 314a may be higher than that of the bottom temperature adjusting unit 314b. By adjusting the temperatures of the lateral temperature adjusting unit 314a and the bottom temperature adjusting unit 314b as described above, excessive adsorption of the gas to the side portion (sidewall portion) may be suppressed and the amount of the gas adsorbed to the side portion or the bottom of the transfer chamber 203 may be reduced.

The adsorption preventing part 302 made of the same material as that of the process chamber 201 may be installed on the surface of the inner wall of the transfer chamber 203. For example, when the adsorption preventing part 302 is made of quartz which is the same material as that of the process chamber 201, the reaction gas may be prevented from reacting with the lower vessel, and the same cleaning gas can be used when cleaning the process chamber 201 and the transfer chamber 203. The adsorption preventing part 302 may be made of a material (film) which hardly reacts with an oxygen-containing gas such as $H_2O_2$. The absorption preventing portion 302 may include a film formed on the surface of the lower vessel 202b. The absorption preventing portion 302 may be a plate shaped member.

<Exhaust System>

An exhaust port 221, which is a part of a first exhaust unit for exhausting an inner atmosphere of the process chamber 201, is connected to the surface of the inner wall of the process chamber 201 (the upper vessel 202a). An exhaust pipe 224, which is a first exhaust pipe, is connected to the exhaust port 221. A pressure controller 227 such as an APC (Automatic Pressure Controller) that control the inner pressure of the process chamber 201 and a vacuum pump 223 are connected in-line to the exhaust pipe 224 in order. The first exhaust unit (exhaust line) includes the exhaust port 221, the exhaust pipe 224 and the pressure controller 227. The first exhaust unit may further include the vacuum pump 223.

A transfer chamber exhaust port 304, which is a part of a second exhaust unit for exhausting an inner atmosphere of the transfer chamber 203, is connected to a lower portion of the side wall of the transfer chamber 203. An exhaust pipe 306, which is a second exhaust pipe, is connected to the transfer chamber exhaust port 304. A valve 308, a pressure controller 310 such as an APC (Automatic Pressure Controller) that control the inner pressure of the transfer chamber 203 and a vacuum pump 312 are connected in-line to the exhaust pipe 306 in order. The second exhaust unit (exhaust line) includes the transfer chamber exhaust port 304, the valve 308, the exhaust pipe 306 and the pressure controller 310. The second exhaust unit may further include the vacuum pump 312.

<Gas Introduction Port>

A shower head 234 is installed at the upper portion of the process chamber 201. A gas introduction port 241 for supplying various gases into the process chamber 201 is installed at the ceiling of the shower head 234. A detailed configuration of each gas supply unit connected to the gas introduction port 241 will be described later.

<Gas Dispersion Unit>

The showerhead 234, which is a gas dispersion unit, includes a buffer chamber 232 (buffer space) and a dispersion plate 234a provided with dispersion holes 234b. The shower head 234 is provided between the gas introduction port 241 and the process chamber 201. A gas supplied through the gas introduction port 241 is supplied to the buffer chamber 232 of the shower head 234. The shower head 234 is made of a material such as quartz, alumina, stainless steel (SUS) and aluminum (Al).

<Process Gas Supply System>

A gas supply pipe 150 is connected to the gas introduction port 241 through a common gas supply pipe 242. Various gases are supplied into the substrate processing apparatus 100 through the gas introduction port 241. A first gas, a second gas, a third gas, a fourth gas and a purge gas, which are described later, are supplied through the gas supply pipe 150.

Figure 2:
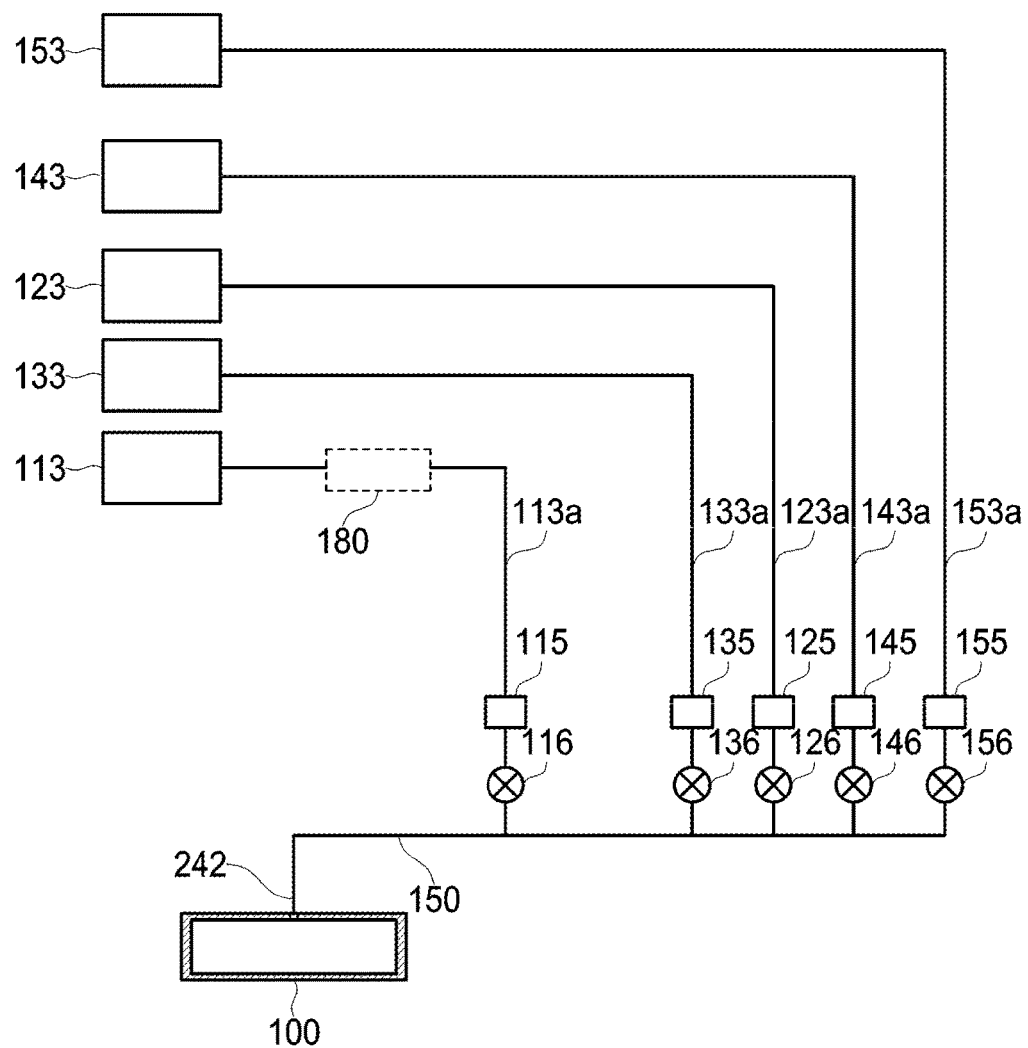
FIG. 2 schematically illustrates a configuration of a gas supply system according to the embodiment.

FIG. 2 schematically illustrates the configuration of a gas supply system including a first gas supply unit, a second gas supply unit, a third gas supply unit, a fourth gas supply unit and a purge gas supply unit.

As shown in FIG. 2, a first gas (metal-containing gas) supply pipe 113a, a purge gas supply pipe 133a, and a second gas (first oxygen-containing gas) supply pipe 123a, a third gas (second oxygen-containing gas) supply pipe 143a and a fourth gas (third oxygen-containing gas) supply pipe 153a are connected to the gas supply pipe 150.

<First Gas Supply Unit>

The first gas supply unit includes the first gas supply pipe 113a, a mass flow controller (MFC) 115 and a valve 116. The first gas supply unit may further include a first gas supply source 113 connected to the first gas supply pipe 113a. When the source of the process gas source is liquid or solid, the first gas supply unit may further include an evaporator 180.

The first gas is a source gas, which is one of the process gases. The first gas may be a metal-containing gas such as an aluminum-containing gas. For example, TMA (Trimethyl Aluminum) gas may be used as the aluminum-containing gas. The source of the first gas may be solid, liquid or gas at room temperature and under atmospheric pressure. Hereinafter, the source of the first gas is assumed to be a gas. The source containing an alkyl group and silicon (Si) or a metal element such as aluminum (Al), gallium (Ga), hafnium (Hf) and zirconium (Zr) and may be used. For example, a gas such as TMGa (trimethyl galium) gas, TMTi (trimethyl titanium) gas, TMHf (trimethyl hafnium) gas and TMS (tetramethyl silane) gas may be used as the metal-containing gas.

<Second Gas Supply Unit>

The second gas supply unit (the first oxygen-containing gas supply unit) includes the second gas supply pipe 123a, an MFC 125 and a valve 126. The second gas supply unit may further include a second gas supply source 123 connected to the second gas supply pipe 123a. The second gas supply unit may further include a remote plasma unit (RPU) (not shown) configured to activate the second gas. When an organic film described later is formed on the substrate 200 in advance, a remote plasma unit is not required, and the substrate 200 may be processed by the second gas in non-plasma state. The second gas is a source gas, i.e., one of the process gases. For example, the second gas may include an oxygen-containing gas which is the first oxygen-containing gas. For example, hydrogen peroxide ($H_2O_2$) gas may be used as the first oxygen-containing gas. In order not to affect the organic film which is a mask, a gas that is more reactive with the metal-containing gas than with the organic film, may be used as the first oxygen-containing gas.

<Purge Gas Supply Unit>

The purge gas supply unit (inert gas supply unit) includes the purge gas supply pipe 133a, an MFC 135 and a valve 136. The purge gas supply unit may further include a purge gas supply source 133 connected to the purge gas supply pipe 133a. The purge gas may include $N_2$ gas. Rare gases such as helium (He) gas, argon (Ar) gas and neon (Ne) gas may be used as the purge gas as well as $N_2$ gas.

<Third Gas Supply Unit>

The third gas supply unit (the second oxygen-containing gas supply unit) includes the third gas supply pipe 143a, an MFC 145 and a valve 146. The third gas supply unit may further include a third gas supply source 143 connected to the third gas supply pipe 143a. The third gas may include an oxygen-containing gas (second oxygen-containing gas). For example, water vapor ($H_2O$) may be used as the second oxygen-containing gas. The third gas supply unit may further include a remote plasma unit (RPU) (not shown) configured to activate the third gas. If the third gas is activated, a gas which does not generate active oxygen should be selected as the third gas. For example, $O_3$ gas and $O_2$ gas produce active oxygen when activated. When active oxygen is supplied to the substrate 200 described later, the organic film formed on the substrate 200 may be ashed. In order to prevent the ashing of the organic film, a gas which does not generate active oxygen even when activated should be used as the third gas. Preferably, a oxidizing agent containing OH bond such as $H_2O$ and $H_2O_2$ may be used as the first oxygen-containing gas or the second oxygen-containing gas since it hardly generates active oxygen even when activated.

<Fourth Gas Supply Unit>

The fourth gas supply unit (the third oxygen-containing gas supply unit) includes the fourth gas supply pipe 153a, an MFC 155 and a valve 156. The fourth gas supply unit may further include a fourth gas supply source 153 connected to the fourth gas supply pipe 153a. The fourth gas may include an oxygen-containing gas (third oxygen-containing gas). For example, hydrogen peroxide ($H_2O_2$) gas may be used as the third oxygen-containing gas. When the fourth gas supply unit supplies the same gas as the second gas supply unit, the second gas supply unit may be used as the fourth gas supply unit without a separate fourth gas supply unit.

<Control Unit>

As shown in FIG. 1, the substrate processing apparatus 100 includes a controller 260 configured to control components thereof.

Figure 3:
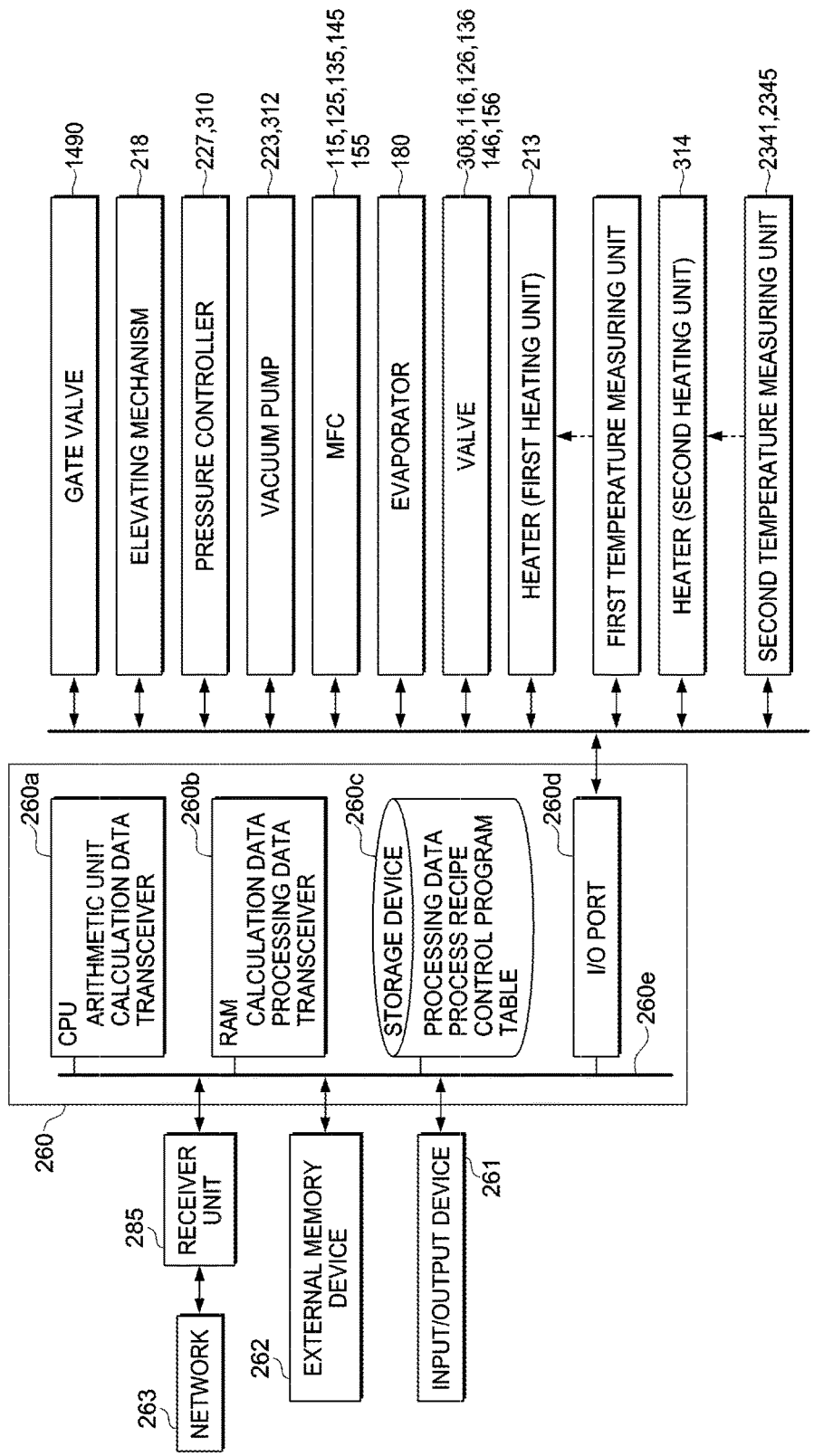
FIG. 3 schematically illustrates a configuration of a controller of the substrate processing system according to the embodiment.

FIG. 3 schematically illustrates the configuration of the controller 260. The controller 260, which is the control unit, may be embodied by a computer having a CPU (Central Processing Unit) 260a, a RAM (Random Access Memory) 260b, a storage device 260c and an I/O port 260d. The RAM 260b, the storage device 260c and the I/O port 260d may exchange data with the CPU 260a via an internal bus 260e. An input/output device 261 such as a touch panel, an external memory device 262 and a receiver unit 285 may be connected to the controller 260.

The storage device 260c may be embodied by components such as flash memory and HDD (Hard Disk Drive). A control program for controlling the operation of the substrate processing apparatus; a process recipe in which information such as the order and condition of the substrate processing is stored; and calculation data and processing data generated during the processing of the wafer 200 are readably stored in the storage device 260c. The process recipe is a program that is executed in the controller 260 to obtain a predetermined result by performing sequences of the substrate processing. Hereinafter, the process recipe and the control program are collectively referred to simply as a program. The term "program" may refer to only the process recipe, only the control program, or both. The RAM 260b is a work area in which data such as the program, the calculation data and the processing data read by the CPU 260a are temporarily stored.

The I/O port 260d is connected to the components such as the evaporator 180, the gate valve 1490, the elevating mechanism 218, the heater 213, the second heating unit 314, the pressure controllers 227 and 310, the vacuum pumps 223, 239 and 312, the valves 116, 126, 136, 146, 156 and 308 and the MFCs 115, 125, 135, 145 and 155.

The CPU 260a serving as the arithmetic unit is configured to read and execute the control program stored in the storage device 260c, and read the process recipe in accordance with an instruction such as an operation command inputted from the input/output device 260. The CPU 260a may compute the calculation data by comparing a value inputted from the receiver unit 285 with the process recipe or control data stored in the storage device 260c. The CPU 260a may select the process recipe based on the calculation data. The CPU 260a may be configured to perform operation such as the opening and closing operations of the gate valve 1490, the operation of the elevating mechanism 218, the power supply to the heater 213 and the second heating unit 314, the pressure adjusting operations of the pressure controllers 227 and 310, the operations of the vacuum pumps 223, 239 and 312, the operations of the valves 116, 126, 136, 146, 156 and 308, and the operations of the MFCs 115, 125, 135, 145 and 155.

The controller 260 may be embodied by a dedicated computer or a general purpose computer. The controller 260 of the embodiment may be embodied by preparing the external memory device 262 (e.g. magnetic tapes, magnetic disks such as flexible disk and hard disk, optical disks such as CD and DVD, magneto-optical disks such as MO, and semiconductor memories such as USB memory and memory card) and installing the program on the general purpose computer using the external memory device 262. The method of providing the program to the computer is not limited to the external memory device 262. The program may be directly provided to the computer using a communication means such as a network 263 (Internet or dedicated line) without the external memory device 262. The storage device 260c or the external memory device 262 may be embodied by a computer-readable recording medium. Hereinafter, the storage device 260c or the external memory device 262 may be collectively referred to as recording medium. Hereinafter, the term "recording medium" may refer to only the storage device 260c, only the external memory device 262, or both.

(2) Substrate Processing

Next, a manufacturing process of a semiconductor device using the above-described substrate processing apparatus will be described by way of an exemplary sequence of steps of forming a metal oxide in the organic film 2003 by oxidizing the metal-containing gas that has been penetrated the organic film 2003 on the substrate with reference to FIGS. 4, 5 and 9. When the metal-containing gas is oxidized, a metal oxide (metal oxide film) is also formed on the surface of the organic film 2003. The metal oxide film formed on the surface of the organic film 2003 suppresses the penetration of molecules of the metal-containing gas into the organic film 2003. That is, the metal oxide film reduces the amount of metal oxide formed in the organic film 2003 such that the strength or the etching resistance of the organic film 2003 cannot not reach a desired level. Further, in order to obtain the desired strength or the desired etching resistance of the organic film 2003, the processing time is undesirably prolonged, resulting in reduced processing.

In order to solve this problem, the concentration of the second gas may be gradually increased. For example, the second gas may be supplied according to the gas supply sequences shown in FIGS. 5, 6, 7 and 8. When the ratio of the amount (or the supply rate) of the second gas to the amount (or the supply rate) of the second gas supplied in the first processing step is different from the ratio of the amount (or the supply rate) of the second gas to the amount (or the supply rate) of the second gas supplied in the second processing step as shown in the gas supply sequence of FIG. 5, the amount of metal oxide formed on the surface of the organic film 2003 may be reduced and the metal oxide may be formed in the organic film 2003. That is, for example, when the amount (or the supply rate) of the second gas supplied in the first processing step is greater than that of the second gas supplied in the second processing step as shown FIG. 5, the metal oxide may be formed in the organic film 2003.

In the following description, the operations the components constituting the substrate processing apparatus 100 are controlled by the controller 260.

Hereinafter, the term "wafer" refers to "wafer itself" or "stacked structure of wafer and layer or film formed on the surface thereof" (collectively to "the wafer and the layer or the film formed on the surface thereof"). "Surface of wafer" may be refers to "surface of wafer itself" or "surface of layer or film formed on the surface of wafer" (i.e. "top surface of the stacked structure").

Thus, in the specification, "supplying a predetermined gas to a wafer" refers to "directly supplying a predetermined gas to a surface (exposed surface) of the wafer itself" or "supplying a predetermined gas to a layer or film formed on a wafer" (i.e. "supplying a predetermined gas to the top surface of the stacked structure"). In the specification, "forming a predetermined layer (or film) on a wafer" refers to "forming a predetermined layer (or film) directly on the surface (exposed surface) of the wafer itself" or "forming a predetermined layer (or film) on the stacked structure" ((i.e. "forming a predetermined layer (or film) on the top surface of the stacked structure").

The term "substrate" is used in the same sense as "wafer" in the specification, and the term "wafer" may be replaced by "substrate."

Substrate processing will be described hereinafter.

<Substrate Loading Step S201>

Figure 9:
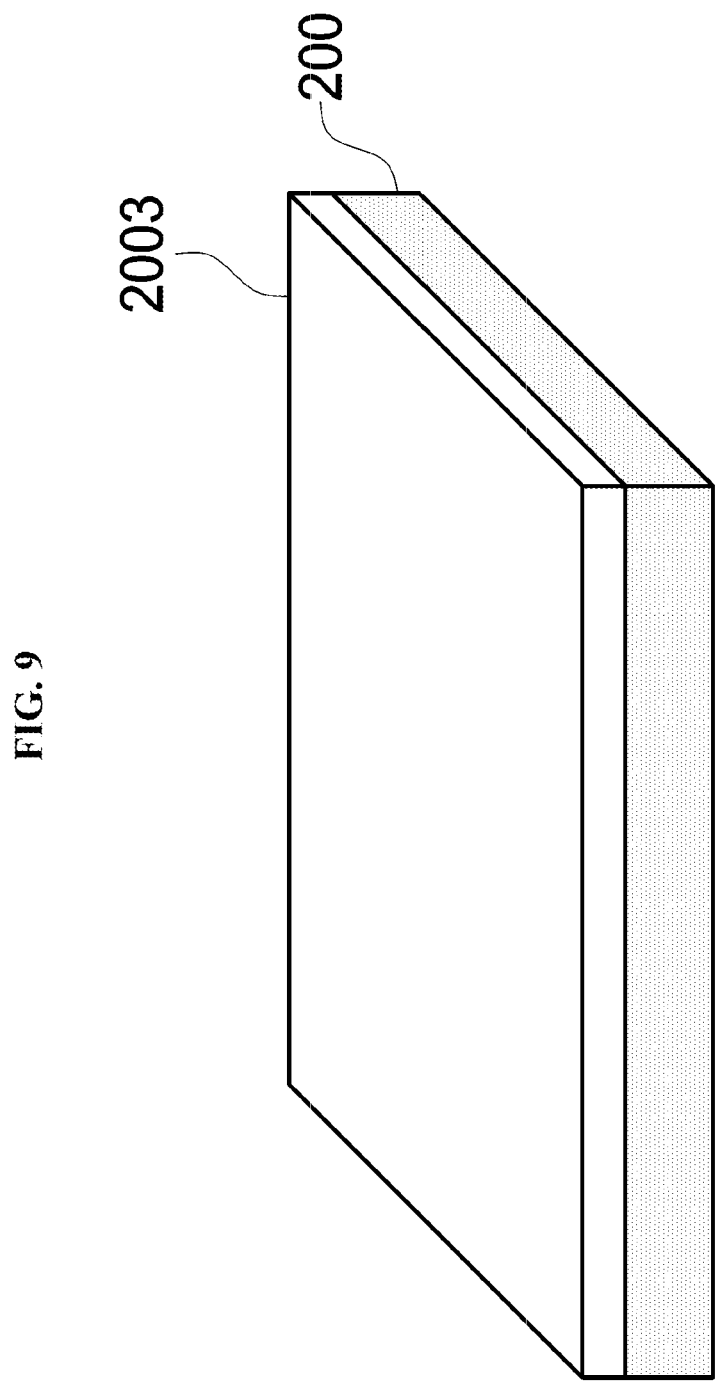
FIG. 9 exemplifies a substrate used in the substrate processing according to the embodiment.

In a film-forming process, as shown in FIG. 9, the wafer 200 (substrate) having the organic film 2003 thereon is loaded into the process chamber 201. Specifically, the substrate support unit 210 is lowered by the elevating mechanism 218, the lift pins 207 protrude from the upper surface of the substrate support unit 210 through the through-holes

214. After the inner pressure of the process chamber 201 is adjusted to a predetermined pressure, the gate valve 1490 is opened. The wafer 200 is transferred through the gate valve 1490 and placed on the lift pins 207. After the wafer 200 is placed on lift pins 207, by elevating the substrate support unit 210 is elevated to a predetermined position by the elevating mechanism 218, the wafer 200 is transferred from the lift pins 207 to the substrate support unit 210.

The organic film 2003 is made of, for example, an organic resin. The organic film 2003 is, for example, a mask film used in a patterning step. The organic resin may include PMMA (polymethyl methacrylate). The mask film is also referred to as "photoresist film."

<Depressurization and Temperature Elevating Step (S202)>

Next, the process chamber 201 is exhausted through the exhaust pipe 224 of the process chamber 201 until the inner pressure of the process chamber 201 reaches a predetermined level (vacuum level). At this time, the opening degree of the pressure controller 227, which is an APC valve, is feedback-controlled based on the pressure measured by a pressure sensor (not shown). The amount of currents applied to the heater 213, a dispersion plate heater 234*c* and the second heating unit 314 are feedback-controlled based on the temperature detected by a temperature sensor (not shown) until the inner temperature of the process chamber 201 reaches a predetermined temperature which is higher than an inner temperature of the transfer chamber 203. Specifically, the substrate support unit 210 is pre-heated by the heater 213 until the temperature of the wafer 200 or the temperature of the substrate support unit 210 is stable. When gas from members or moisture is present in the process chamber 201, the gas or the moisture may be removed by vacuum-exhaust or purged with $N_2$ gas. The pre-processing step before the film-forming process is now complete. It is preferable that the process chamber 201 is exhausted to a vacuum level as much as possible until the inner pressure thereof reaches the predetermined pressure.

In this case, the temperature of the heater 213 may range from room temperature to 150° C., preferably from room temperature to 90° C., more preferably from 60° C. to 90° C. The temperature of the heater 213 is such that one of or both of the first gas and the second gas is adsorbed on the wafer 200. That is, the temperature of the heater 213 is such that a chemical reaction between one of or both of the first gas and the second gas and the wafer 200 occurs. Preferably, the temperature of the heater 213 is such that the film formed on the wafer 200, e.g. the organic film, is not deteriorated. The temperature of the second heating unit 314 (the lateral temperature adjusting unit 314*a* and the bottom temperature adjusting unit 314*b*) may range from 100° C. to 200° C. The temperature of the second heating unit 314 is such that adsorption or decomposition is suppressed as described above.

<First Processing Step>

Hereinafter, an example of forming a metal oxide in the organic film 2003 on the wafer 200 will be described. The first processing step will be described in detail with reference to FIG. 4 and FIG. 5.

Figure 4:
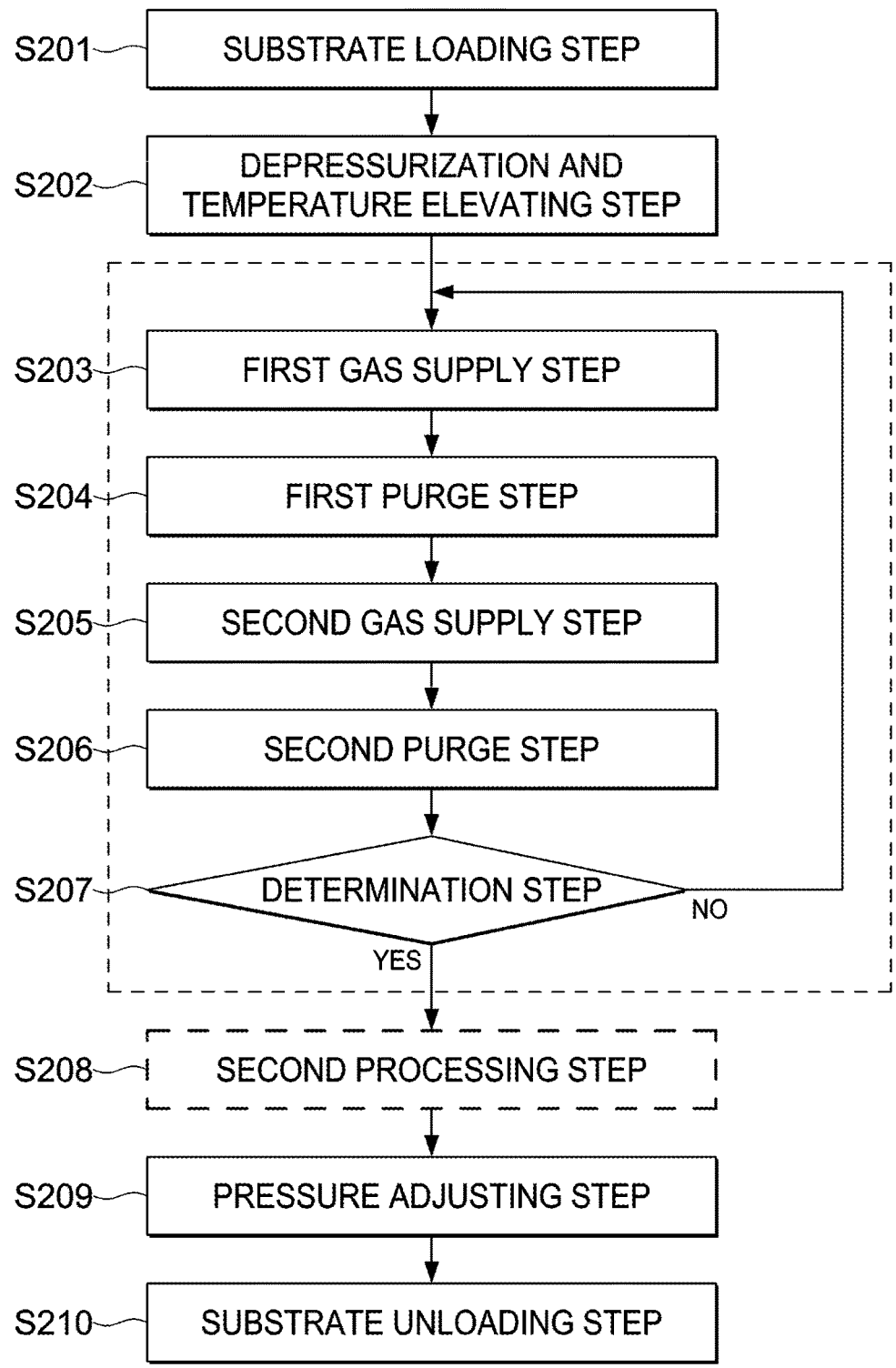
FIG. 4 is a flowchart illustrating a substrate processing according to the embodiment.
Figure 5:
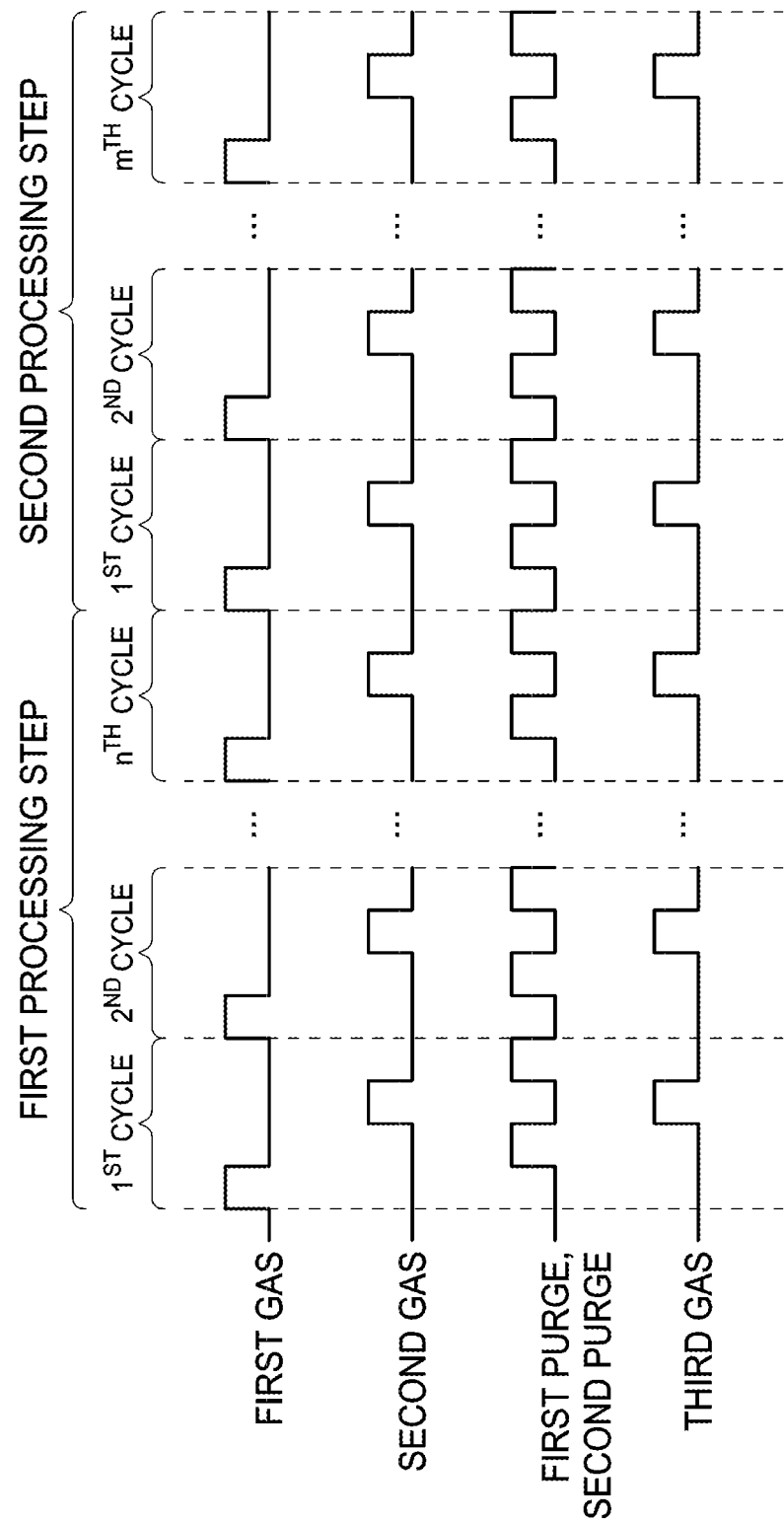
FIG. 5 exemplifies a sequence of the substrate processing according to the embodiment.

When the wafer 200 is placed on the substrate support unit 210, and the inner atmosphere of process chamber 201 is stabilized, the first processing step (steps S203 through S207) shown in FIG. 4 is performed.

<First Gas Supply Step (S203)>

In the first gas supply step S203, a metal-containing gas, which is the first gas (source gas), is supplied into the process chamber 201 by the first gas supply unit. For example, the metal-containing gas includes TMA gas. Specifically, by opening the valve 116, the metal-containing gas having the flow rate thereof adjusted by the MFC 115 is supplied from the first gas supply source 113 to the substrate processing apparatus 100. The metal-containing gas having the flow rate thereof adjusted is then supplied to the depressurized process chamber 201 through the buffer chamber 232 and the dispersion holes 234*b* of the shower head 234. The exhaust system continuously exhausts the process chamber 201 such that the inner pressure of process chamber 201 is maintained at a predetermined pressure. At this time, the metal-containing gas is supplied to the wafer 200 in the process chamber 201 at a predetermined pressure (first pressure ranging from 100 Pa to 20000 Pa for example). When the metal-containing gas is supplied to the wafer 200, the molecules of the metal-containing gas penetrates into the organic film 2003 on the wafer 200. Specifically, the molecules containing aluminum penetrates into the organic film 2003.

<First Purge Step (S204)>

After the molecules of metal-containing gas penetrates into the organic film 2003 on the wafer 200, the supply of the metal-containing gas is stopped. The first purge step S204 is performed by stopping the supply of the metal-containing gas (source gas) and exhausting the source gas present in the process chamber 201 or the buffer chamber 232 through the exhaust pipe 224.

In the first purge step S204, the remaining gas may be extruded by further supplying an inert gas in addition to exhausting the remaining gas by the vacuum exhaust. That is, the vacuum exhaust may be combined with the supply of the inert gas. In the alternative, the vacuum exhaust and the supply of the inert gas may be alternatively performed.

In the first purge step S204, the flow rate of $N_2$ gas supplied into the process chamber 201 does not need to be large. For example, by supplying the same amount of $N_2$ gas as the volume of the process chamber 201, purge can be performed to such an extent that adverse effects on the subsequent step do not occur. Since the inside of the process chamber 201 is not completely purged, the purge time can be shortened while throughput is improved. Furthermore, the consumption of $N_2$ gas can be suppressed to the minimum.

Preferably, the flow rate of the $N_2$ gas, which is a purge gas supplied by the inert gas supply unit, may range from 100 sccm to 20000 sccm. Rare gases such as argon (Ar), helium (He), neon (Ne) and xenon (Xe) may be used as the purge gas as well as $N_2$ gas.

Since the first gas adsorbed on a portion of the surface of the wafer 200 where the organic film 2003 is not formed or the first gas adsorbed on the surface of the organic film 2003 undesirably reacts with the second processing gas supplied in the subsequent step. Therefore, it is preferable to remove the adsorbed first gas the purge step.

<Second Gas Supply Step (S205)>

After the first purge step S204 is performed, the second gas (reactive gas), which is the first oxygen-containing gas, is supplied into the process chamber 201 through the gas introduction port 241 and the dispersion holes 234*b*. Hereinafter, an example in which hydrogen peroxide ($H_2O_2$) is used as the first oxygen-containing gas will be described. The second gas may be uniformly supplied onto the substrate in the process chamber 201 via the dispersion holes 234*a*. Thus, the uniformity of the film thickness may be improved. The activated second gas may be supplied to the process chamber 201 via the activation unit (excitation unit).

At this time, the MFC 244c adjusts the flow rate of the $H_2O_2$ gas to a predetermined value. For example, the flow rate of $H_2O_2$ gas may range from 100 sccm to 10000 sccm.

In the second gas supply step S205, the third gas (dilute gas) is supplied. The third gas may include one of or both of the second oxygen-containing gas and an inert gas. In this embodiment, the second gas supply step S205 described by way of an example wherein water vapor ($H_2O$) is used as the second oxygen-containing gas. As shown in FIG. 5, the flow rate of the third gas is greater than the flow rate of the second gas.

After a predetermined time elapses, the supplies of the second gas and the third gas are stopped.

When $H_2O_2$ gas (the second gas) is supplied to the organic film 2003 with the molecules of the metal-containing gas penetrated therein, the $H_2O_2$ gas penetrates into the organic film 2003, thereby oxidizing the molecules of the metal-containing gas. As a result, the metal oxide is formed in the organic film 2003. Specifically, aluminum oxide (AlO) is formed in the organic film 2003.

<Second Purge Step (S206)>

The second purge step S206 same as the first purge step S204 is performed. For example, the supply of $H_2O_2$ gas is stopped and the $H_2O_2$ gas present in the process chamber 201 or the $H_2O_2$ gas present in the buffer chamber 232 is exhausted by the first exhaust unit.

<Determination Step (S207)>

After the second purge step S206 is complete, the controller 260 determines whether the first processing step (including the step S203 through the step S206) is performed a predetermined number of times (n times, where n is a natural number). The metal oxide may be formed in the organic film 2003 on the wafer 200 by performing the cycle including the step S203 through the step S206 at least once. It is preferable that the cycle is performed multiple times. By performing the cycle, the organic film 2003 having therein a predetermined amount of metal oxide is formed on the wafer 200.

When it is determined at the determination step S207 that the first processing step (including the step S203 through the step S206) was not performed the predetermined number of times, i.e. n times ("No" in FIG. 4), the cycle of the first processing step (including the step S203 through the step S206) is repeated. On the other hand, when it is determined at the determination step S207 that the first processing step (including the step S203 through the step S206) was the predetermined number of times, i.e. n times ("Yes" in FIG. 4), the first processing step (including the step S203 through the step S206) is ended and a second processing step S208, a transfer pressure adjusting step S209 and a substrate unloading step S210 are sequentially performed thereafter.

<Second Processing Step S208>

After the first processing step including the steps S203 through S207 is performed, the second processing step S208 is performed. In the second processing step S208, the first gas is supplied in the same manner as the step S203 of the first processing step. Next, a purge process is performed, and the second gas and the third gas are then supplied. The amount (or flow rate) of the second gas supplied in the second processing step S208 is greater than the amount (or flow rate) of the second gas supplied in step S205 of the first processing step. The amount (or flow rate) of the second gas supplied in the second processing step S208 is equal to or greater than the amount (or flow rate) of the third gas supplied in the second processing step S208. Thereafter, another purge process is performed. The second processing step S208 is performed a predetermined number of times (m times, where m is a natural number).

As described above, by performing the first processing step including the steps S203 through S207 and the second processing step S208, the metal oxide may be uniformly formed from the inside of the organic film 2003 to the surface of the organic film 2003 on the wafer 200.

<Transfer Pressure Adjusting Step S209>

In the transfer pressure adjusting step S208, the inner atmosphere of the process chamber 201 or the inner atmosphere of the transfer chamber 203 is exhausted through the exhaust pipe 224 or the transfer chamber exhaust port 304 such that the inner pressure of the process chamber 201 or the transfer chamber 203 becomes a predetermined pressure (vacuum level). The inner pressure of the process chamber 201 or the transfer chamber 203 is adjusted such that the inner pressure of the process chamber 201 or the transfer chamber 203 is equal to or lower than the inner pressure of the vacuum transfer chamber (not shown). The wafer 200 may be supported by the lift pins 207 until the wafer 200 is cooled to a predetermined temperature before, during or after the transfer pressure adjusting step S209.

<Substrate Unloading Step S210>

After the inner pressures of the process chamber 201 and the transfer chamber 203 are adjusted to a predetermined pressure in the transfer pressure adjusting step S209, the gate valve 1490 is opened, and the wafer 200 is unloaded to the vacuum transfer chamber (not shown) from the transfer chamber 203.

The organic film 2003 on the wafer 200 is processed by above-described steps.

Figure 6:
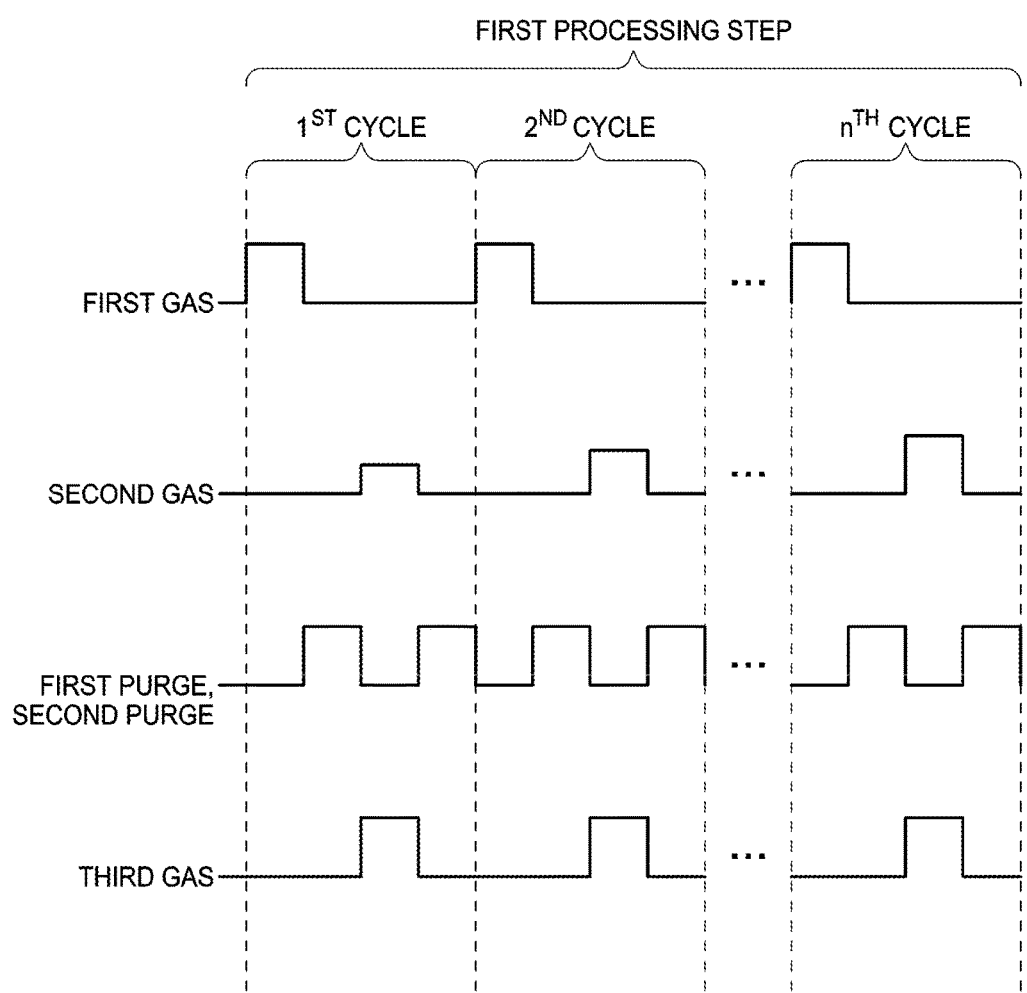
FIG. 6 exemplifies another sequence of the substrate processing according to the embodiment.

While the embodiment in which the substrate processing is performed by two steps of the first processing step and the second processing step, the above described technique is not limited thereto. For example, the amount of the second gas may be varied in the first processing step without performing the second processing step S208 as shown in FIG. 6. As shown in FIG. 6, the amount of the first oxygen-containing gas (second gas) may be gradually increased as the cycle is repeated. That is, the supply rate of the first oxygen-containing gas may be increased in every cycle.

Figure 7:
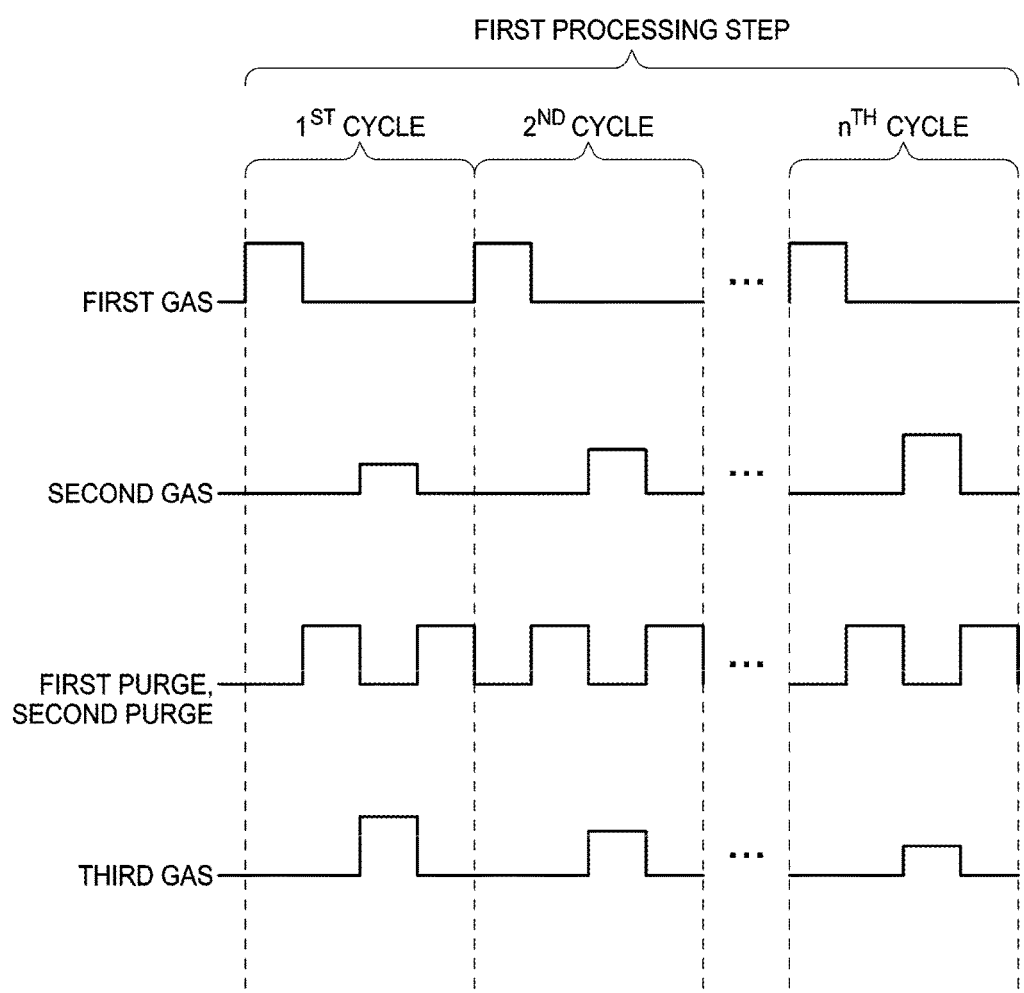
FIG. 7 exemplifies yet another sequence of the substrate processing according to the embodiment.

The above-described technique may also be applied to the substrate processing performed according to the sequence shown in FIG. 7. Referring to FIG. 7, the supply rate of the second gas is increased as the cycle is repeated, and the supply rate of the third gas is decreased as the cycle is repeated.

Figure 8:
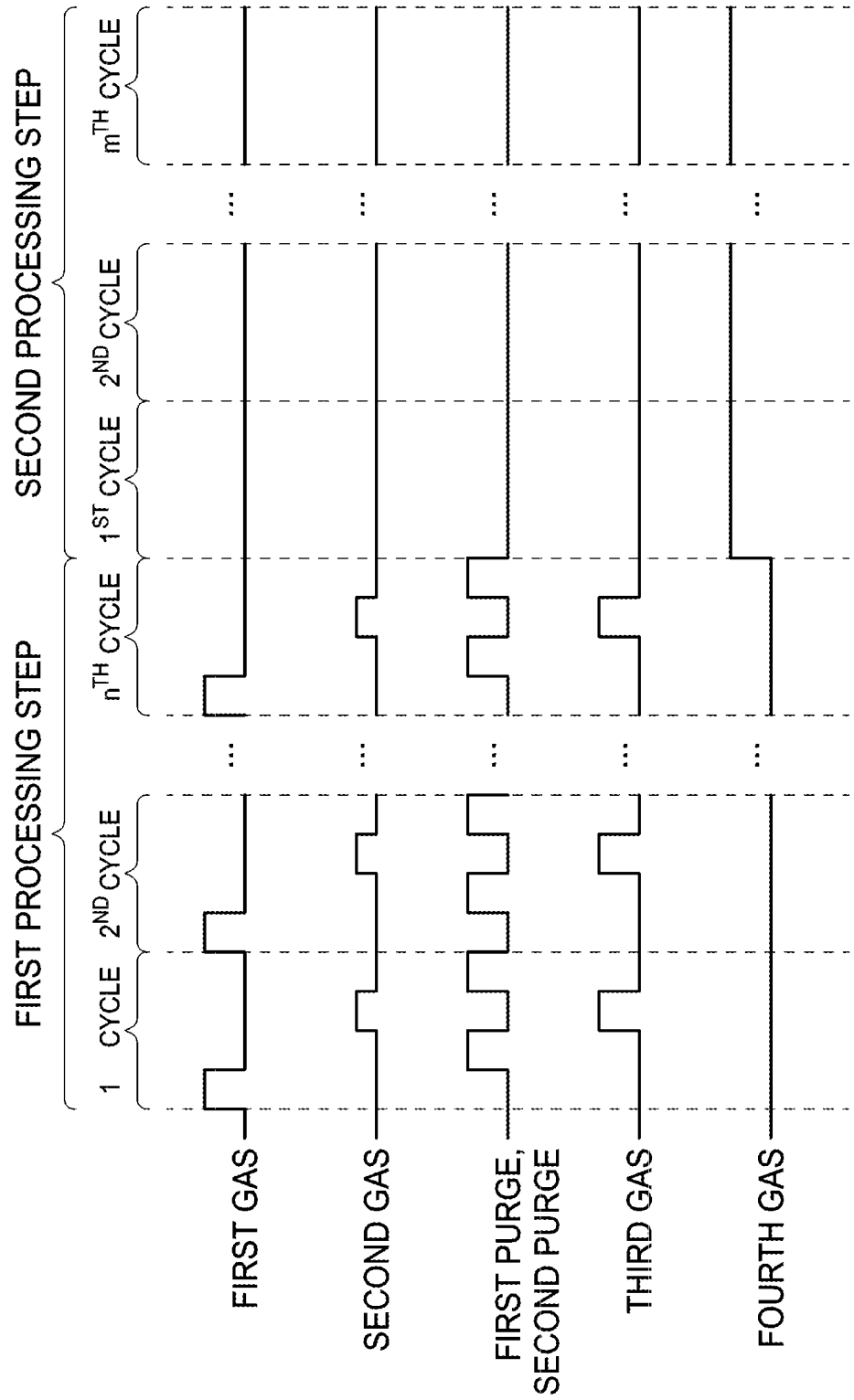
FIG. 8 exemplifies yet another sequence of the substrate processing according to the embodiment.

The above-described technique may also be applied to the substrate processing performed according to the sequence shown in FIG. 8. Referring to FIG. 8, the first processing step is performed in the same manner as the sequence shown in FIG. 5. However, in the second processing step, the supply of the first gas, the first purge, the second purge and the supply of the third gas are not performed and the wafer 200 is annealed while supplying only the fourth gas. Referring again to FIG. 8, after the steps S203 to S207 of the first processing step described above are performed, the third oxygen-containing gas (fourth gas) is introduced into the process chamber 201 via the gas inlet 241 and the dispersion holes 234a. Preferably, hydrogen peroxide ($H_2O_2$) is used as the third oxygen-containing gas. By supplying the third oxygen-containing gas into the process chamber 201 via the dispersion holes 234a, the third oxygen-containing gas may be uniformly supplied onto the substrate. Thus, the wafer 200 may be uniformly annealed over the entire surface thereof.

At this time, the MFC 125 adjusts the flow rate of the third oxygen-containing gas ($H_2O_2$ gas) to a predetermined value. For example, the flow rate of the $H_2O_2$ gas may range from 100 sccm to 10000 sccm.

When the $H_2O_2$ gas is supplied to the organic film 2003 formed on the wafer 200, into which the molecules of the first gas (metal-containing gas) has penetrated, the $H_2O_2$ gas, which is an oxidizing agent, penetrates into the organic film 2003 during the annealing process.

After a predetermined time has elapsed, the supply of the $H_2O_2$ gas is stopped. The molecules of the first gas (metal-containing gas) in organic film (2003) are oxidized in the second processing step. Referring to FIG. 8, the fourth gas, i.e., the third oxygen-containing gas, is preferably used in the second processing step. The oxidizing strength of the third oxygen-containing gas is greater than that of the first oxygen-containing gas used in the first processing step. Specifically, in the sequence shown in FIG. 8, water vapor is used as the first oxygen-containing gas (second gas) and the dilute gas is used as the third gas in the first processing step. $H_2O_2$ gas is used as the third oxygen-containing gas (fourth gas) in the second processing step. On the other hand, in the sequence shown in FIG. 8, when the first oxygen-containing gas used in the first processing step is used as the fourth gas (third oxygen-containing gas) in the second processing step, the amount (or concentration or time duration) of the first oxygen-containing gas supplied in the second processing step may be greater than the amount (or concentration or time duration) of the first oxygen-containing gas supplied in the first processing step. When the second gas (first oxygen-containing gas) of the first processing step differs from the fourth gas (third oxygen-containing gas) of the second processing step, the processing throughput may be effectively improved and the gas consumption may be reduced.

Figure 10:
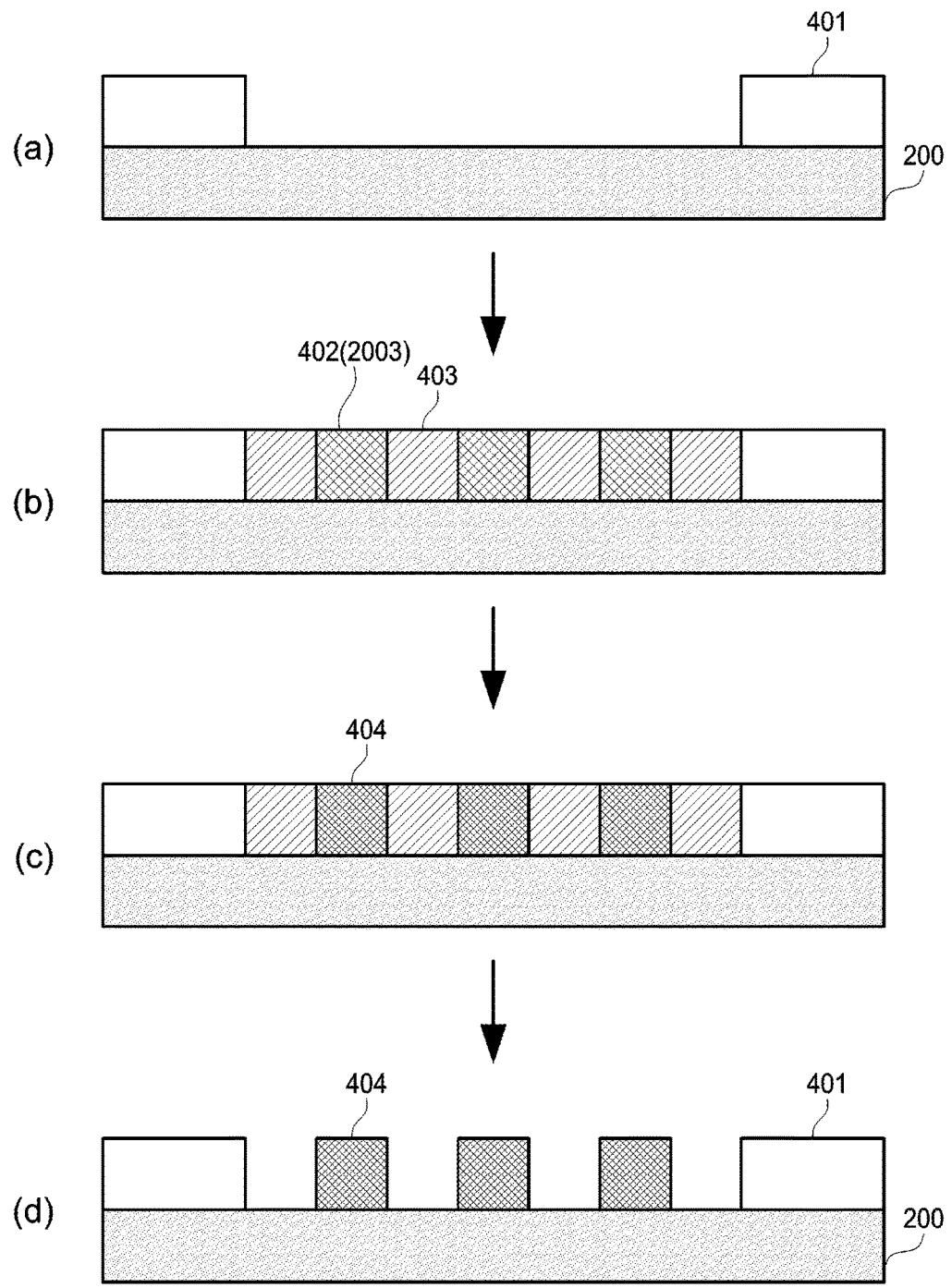
FIG. 10 exemplifies cross-sections of a substrate in each step of a DSA (Directed Self-Assembly) process to which the substrate processing according to the embodiment is applied.

While the embodiment in which the substrate processing is performed according to the sequence shown in FIG. 9, the above described technique is not limited thereto. The above-described technique may also be applied to a substrate processing to DSA (Directed Self-Assembly) process shown in FIG. 10. According to the DSA process, a guide 401 is first formed on wafer 200. Next, two types of photoresist sources are coated on the wafer 200 on which the guide 401 is formed. Two types of photoresist sources are, for example, PMMA (polymethyl methacrylate) and PS (polystyrene). After a predetermined period of time elapses, PMMA 402 and PS 403, which are the organic films 2003, are cured in a regularly arranged state due to the characteristics of the guide 401. Subsequently, the wafer 200 is subjected to substrate processing according to at least one of the sequences shown in FIGS. 4, 5, 6 and 7 described above to modify the PMMA 402 into an aluminum oxide-containing film 404. Thereafter, by removing the PS 403, a pattern is formed on the wafer 200. By forming the aluminum oxide-containing film 404 in this manner, the etching selectivity of the PS 403 may be improved, and fine patterning is facilitated.

The above-described technique may also be applied to a multi-patterning process of a substrate. For example, the above-described technique may be applied to a self-aligned double patterning (SADP) process of a substrate, which is one of the multiple patterning processes, as shown in FIGS. 11A through 11H.

Figure 11A:
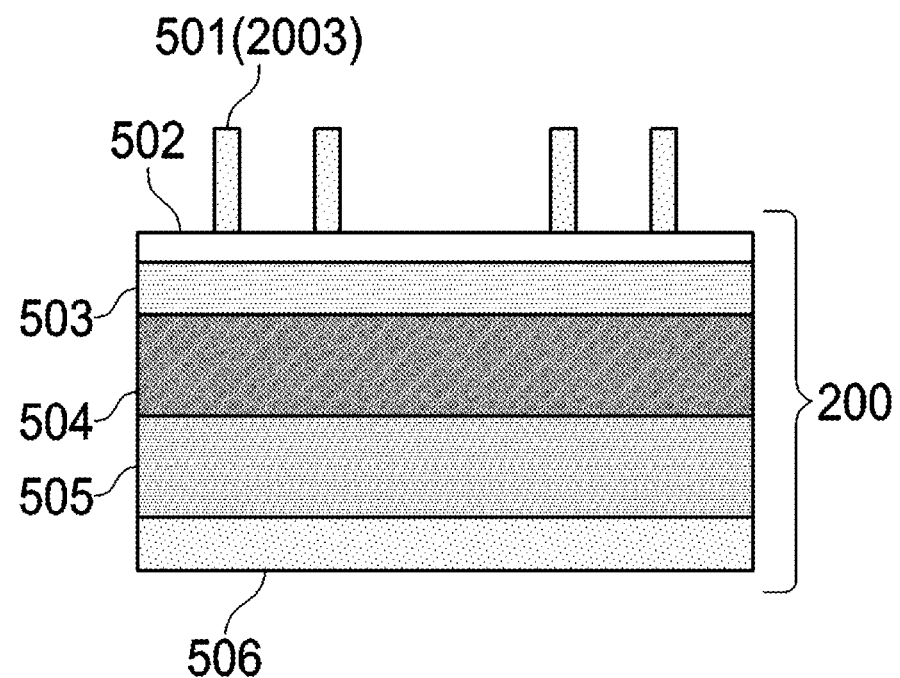
FIG. 11A through 11H exemplify cross-sections of a substrate in each step of a multi-patterning process to which the substrate processing according to the embodiment is applied.

As shown in FIG. 11A, a photoresist 501 (organic film 2003) is patterned and slimmed by lithography. A substrate processing is performed on the substrate with the patterned and slimmed photoresist 501 according to at least one of the examples shown in FIGS. 4, 5, 6 and 7 described above. Thus, the strength and the etching selectivity of the photoresist 501 may be improved, and the pattern may be accurately transcribed in the subsequent step.

Figure 11B:
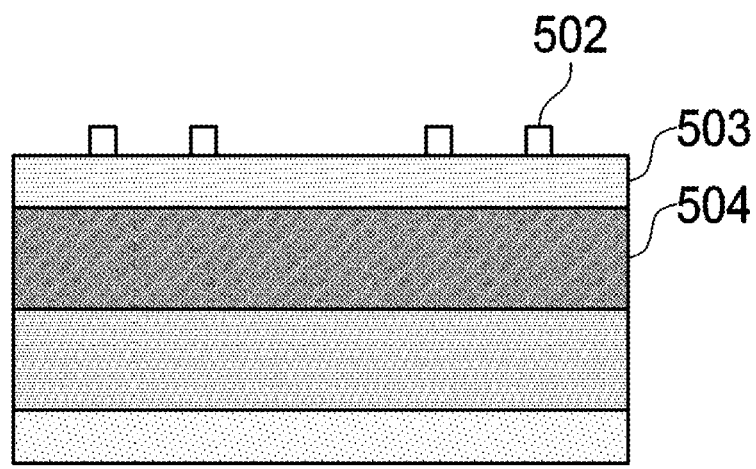
Figure 11C:
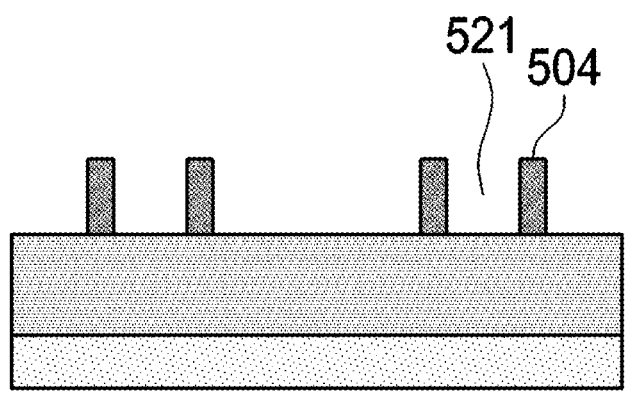

Next, as shown in FIG. 11B, the pattern is transcribed to the silicon anti-reflection film 502 and the carbon hard mask 503 under the patterned photoresist 501 by dry etch using the patterned photoresist 501 as a mask. Next, the photoresist 501 is removed by asher, and the silicon film 504 under the patterned silicon anti-reflection film layer 502 and the carbon hard mask layer 503 is patterned using the patterned silicon anti-reflection film layer 502 and the carbon hard mask layer 503 as a mask. Thereafter, as shown in FIG. 11C, the core pattern (protrusions having silicon as main component) of the silicon film 504 is formed by removing the carbon hard mask layer 503 by asher. A first groove 521 is formed between the protrusions having silicon as main component.

Figure 11D:
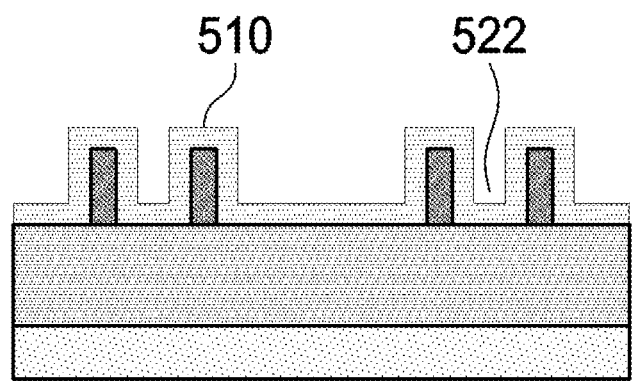
Figure 11E:
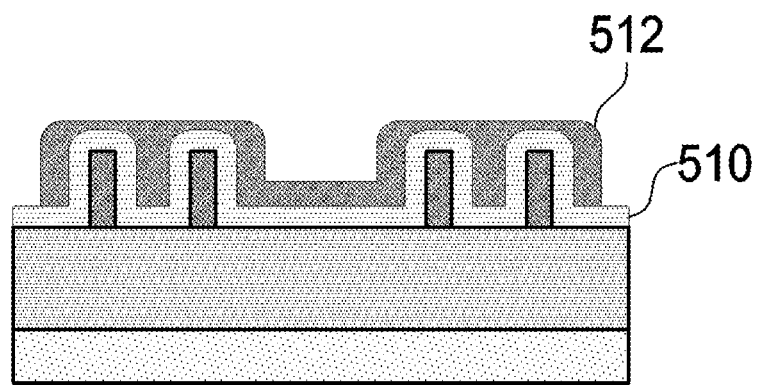

Next, as shown in FIG. 11D, a $SiO_2$ film 510 is formed. Preferably, the $SiO_2$ film 510 may be formed uniformly over the core pattern of the silicon film 504 with superior step coverage. By forming the $SiO_2$ film 510, a second groove 522 is formed. Next, as shown in FIG. 11E, a silicon film 512 is formed on the $SiO_2$ film 510 to cover the $SiO_2$ film 510. The silicon film 512 fills the groove between the side walls of the adjacent $SiO_2$ films 510 in the region where the core pattern of the silicon film 504 is densely arranged. The size and pitch of the core pattern of the silicon film 504 and the thickness of the $SiO_2$ film 510 are selected such that the groove between the adjacent side walls is filled by the silicon film 512 and the width of the gap between the portions of the $SiO_2$ film 510 on the adjacent side walls has a desired size. Specifically, the thickness of the portion of the silicon film 512 formed on the second groove 522 is thicker than the portion of the silicon film 512 formed on other portions. The thickness of the portion of the silicon film 512 formed on other portions of the $SiO_2$ film 510 is uniform except for the portion of the silicon film 512 formed on the second groove 522.

Figure 11F:
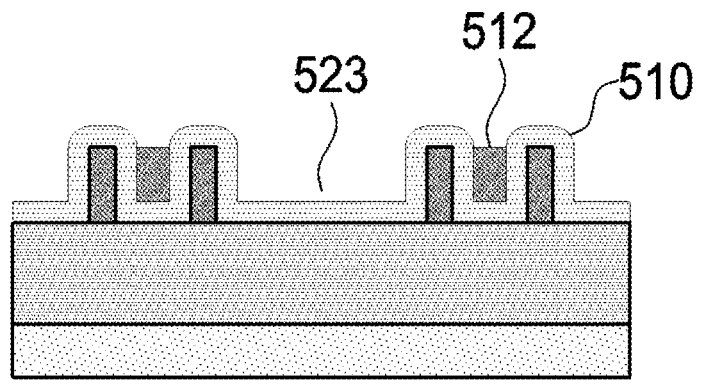

Next, as shown in FIG. 11F, the silicon film 512 is etched under an etching condition such that only the silicon film 512 in the second groove 522 remains. The silicon film 512 on the side wall of the wide groove pattern (third groove 523) and the silicon film 512 at the bottom are completely removed by isotropic etching. The first groove 521 is wider than the second groove 522 and the third groove 523 is wider than the first groove 521. In this step, the etching is performed with an etch selectivity such that silicon film 512 is etched at a high etch rate and the $SiO_2$ film 510 is hardly etched. For example, the etching condition is adjusted such that the silicon film 512 (the portions of the silicon film 512 on the sidewall and at the bottom wall) formed in the third groove 523 and the portion of the silicon film 512 deposited on the silicon film 504 formed on the $SiO_2$ film 510 are completely removed and only the portion of the silicon film 512 formed on the second groove 522 remains. When an etching gas, which is a process gas, is supplied, a process using a removing agent may preferably be performed in advance.

Figure 11G:
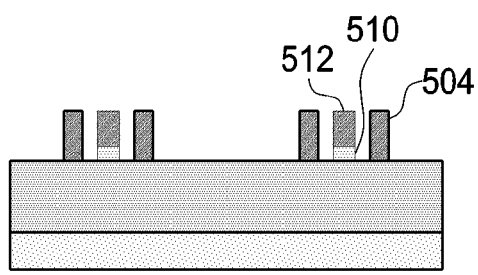
Figure 11H:
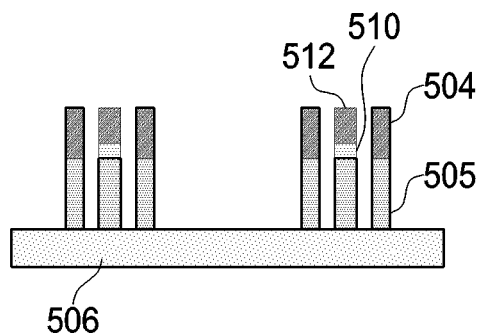

Thereafter, as shown in FIG. 11G, the $SiO_2$ film 510 is dry-etched and the portion of the $SiO_2$ film 510 between the core pattern of the silicon film 504 and the silicon film 512 remaining in the groove of the $SiO_2$ film 510 is removed to form a groove pattern. Next, as shown in FIG. 11H, the $SiO_2$ film 505 is patterned by dry etching using the pattern shown in FIG. 11G, a silicon film 506, which is an etch stopper for the $SiO_2$ film 505, exposed.

While an example wherein the SADP process is performed as a multi-patterning process, the above-described technique may also be applied to a multi-patterning process such as self-aligned quadruple patterning (SAQP) process. The above-described technique may also be applied to a single patterning process as well as a multi-patterning process.

According to the above-described technique, etch selectivity may be improved. Since the patterned organic film (photoresist) may be cured, the shape of the pattern may be maintained even when the pitch is reduced. Moreover, LER (Line Edge Roughness) of the pattern may be reduced.

While an embodiment wherein the source gas and the reactive gas are alternately supplied to process the wafer is exemplified above, the above-described technique may be applied to other methods when the amount of gaseous reaction or the amount of by-products is within an allowed range. For example, the above-described technique may be applied even when the supply of the source gas and the supply of the reactive gas partially overlap.

While the manufacturing process of a semiconductor device is exemplified above, the above-described techniques may be applied to other manufacturing processes. For example, the above-described techniques may be applied to a manufacturing process of a liquid crystal device, a manufacturing process of a solar cell, a manufacturing process of a light emitting device, a processing of a glass substrate, a processing of a ceramic substrate and a processing of a conductive substrate.

While an embodiment wherein an aluminum oxide is formed using TMA gas as a source gas and a $H_2O_2$ gas as a reactive gas, the above-described techniques may be applied to methods using other gases. For example, the above-described technique may also be applied to a formation of an oxygen-containing film, a formation of a nitrogen-containing film, a formation of a carbon-containing film, a formation of a boron-containing film and a formation of a metal-containing film and a formation of a film containing at least two of these elements. The above-described technique may also be applied to a formation of SiO film, SiN film, ZrO film, HfO film, HfAlO film, ZrAlO film, SiC film, SiCN film, SiBN film, TiN film, TiC film and TiAlC film. By comparing characteristics (e. g. adsorption, separation and vapor pressure) of the source gases and the reactive gases used in the formation of the above-described films and modifying the locations of gas supply systems and the structure of the showerhead 234, the same advantageous effects may be achieved.

While a substrate processing apparatus capable of that processing one substrate in one process chamber is exemplified above, the above-described techniques are not limited thereto and may be applied to other substrate processing apparatuses. For example, the above-described technique may also be applied to a substrate processing apparatus capable of processing a plurality of substrates arranged horizontally or vertically.

According to the technique described herein, the uniformity of device characteristics may be improved.

What is claimed is:

1. A method of manufacturing a semiconductor device, comprising:
    (a) accommodating in a process chamber a substrate having an organic film thereon;
    (b) supplying a metal-containing gas to the substrate;
    (c) supplying a first oxygen-containing gas and a dilute gas to the substrate, the dilute gas containing at least one of a second oxygen-containing gas and an inert gas;
    (d) performing a cycle a predetermined number of times, the cycle including (b) and (c), wherein a flow rate of the dilute gas gradually decreases as the cycle is performed or a flow rate of the first oxygen-containing gas gradually increases as the cycle is performed such that the flow rate of the first oxygen-containing gas is greater than the flow rate of the dilute gas in one of the cycle performed the predetermined number of time.

2. The method according to claim 1, further comprising (e) supplying a third oxygen-containing gas after performing (d).

3. The method according to claim 2, wherein the flow rate of the first oxygen-containing gas in (d) is a first flow rate, and the flow rate of the dilute gas in (d) in is a second flow rate.

4. The method according to claim 3, wherein the first oxygen-containing gas and the dilute gas are supplied in order in (d) at the first flow rate and the second flow rate, respectively.

5. The method according to claim 4, wherein the first oxygen-containing gas is more reactive with the metal-containing gas than with the organic film.

6. The method according to claim 5, wherein the first oxygen-containing gas is non-plasma state.

7. The method according to claim 2, wherein the first oxygen-containing gas is more reactive with the metal-containing gas than with the organic film.

8. The method according to claim 2, wherein the first oxygen-containing gas is non-plasma state.

9. The method according to claim 1, wherein the flow rate of the first oxygen-containing gas in (d) is a first flow rate, and the flow rate of the dilute gas in (d) in is a second flow rate.

10. The method according to claim 9, wherein the first oxygen-containing gas and the dilute gas are supplied in order in (d) at the first flow rate and the second flow rate, respectively.

11. The method according to claim 1, wherein the first oxygen-containing gas is more reactive with the metal-containing gas than with the organic film.

12. The method according to claim 1, wherein the first oxygen-containing gas is non-plasma state.

* * * * *